United States Patent
Wang et al.

(10) Patent No.: US 9,508,958 B2
(45) Date of Patent: Nov. 29, 2016

(54) DISPLAY SUBSTRATE AND MANUFACTURING METHOD THEREOF AND DISPLAY DEVICE

(71) Applicant: BOE TECHNOLOGY GROUP CO., LTD., Beijing (CN)

(72) Inventors: Dongfang Wang, Beijing (CN); Guangcai Yuan, Beijing (CN); Hongda Sun, Beijing (CN); Wei Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,984

(22) PCT Filed: Oct. 28, 2014

(86) PCT No.: PCT/CN2014/089665
§ 371 (c)(1),
(2) Date: Apr. 20, 2015

(87) PCT Pub. No.: WO2015/149508
PCT Pub. Date: Oct. 8, 2015

(65) Prior Publication Data
US 2016/0155992 A1  Jun. 2, 2016

(30) Foreign Application Priority Data
Mar. 31, 2014 (CN) .......................... 2014 1 0127750

(51) Int. Cl.
*H01L 51/52* (2006.01)
*H01L 51/56* (2006.01)
(Continued)

(52) U.S. Cl.
CPC ......... *H01L 51/5284* (2013.01); *G02F 1/1339* (2013.01); *G02F 1/133512* (2013.01);
(Continued)

(58) Field of Classification Search
CPC .............. H01L 27/32; H01L 27/1225; H01L 51/5284; H01L 51/56; H01L 2227/323; G02F 1/133512; G02F 1/1339

USPC ......................................................... 438/35
See application file for complete search history.

(56) References Cited

U.S. PATENT DOCUMENTS

| | | | |
|---|---|---|---|
| 2003/0030766 A1* | 2/2003 | Kiguchi | G02B 5/201 349/106 |
| 2003/0176005 A1* | 9/2003 | Takano | H01L 51/0003 438/48 |
| 2014/0098332 A1* | 4/2014 | Kim | G02F 1/133512 349/106 |

FOREIGN PATENT DOCUMENTS

| | | |
|---|---|---|
| CN | 1700814 A | 11/2005 |
| CN | 202141873 U | 2/2012 |

(Continued)

OTHER PUBLICATIONS

International Search Report dated Jan. 30, 2015 issued in corresponding International Application No. PCT/CN2014/089665.
Office Action dated Jan. 28, 2016 issued in corresponding Chinese Application No. 201410127750.5.

*Primary Examiner* — Caridad Everhart
(74) *Attorney, Agent, or Firm* — Nath, Goldberg & Meyer; Joshua B. Goldberg

(57) ABSTRACT

The present invention discloses a display substrate and a manufacturing method thereof and a display device. The display substrate comprises a base substrate and color matrix patterns and photo spacers provided on the base substrate, edges of the adjacent color matrix patterns are overlapped, and the photo spacers are provided above the overlapped parts of the adjacent color matrix patterns. By adopting such a structure, the thickness of the photo spacers can be reduced, the purpose of increasing the cell gap of the display device is achieved while providing thinner photo spacers, and the cell gap of the display device is increased.

14 Claims, 4 Drawing Sheets

(51) Int. Cl.
*H01L 27/32* (2006.01)
*G02F 1/1339* (2006.01)
*G02F 1/1335* (2006.01)
*H01L 27/12* (2006.01)

(52) U.S. Cl.
CPC ......... *H01L27/322* (2013.01); *H01L 27/3262* (2013.01); *H01L 51/56* (2013.01); *H01L 27/1225* (2013.01); *H01L 2227/323* (2013.01)

(56) References Cited

FOREIGN PATENT DOCUMENTS

| | | |
|---|---|---|
| CN | 202494843 U | 10/2012 |
| CN | 102854668 A | 1/2013 |
| CN | 103943659 A | 7/2014 |
| TW | 201038981 A | 11/2010 |

\* cited by examiner

DISPLAY SUBSTRATE AND MANUFACTURING METHOD THEREOF AND DISPLAY DEVICE

This is a National Phase Application filed under 35 U.S.C. 371 as a national stage of PCT/CN2014/089665, filed Oct. 28, 2014, and claims priority benefit from Chinese Application No. 201410127750.5 filed Mar. 31, 2014, the content of each of which is hereby incorporated by reference in its entirety.

FIELD OF THE INVENTION

The present invention relates to the technical field of display, and particularly relates to a display substrate and a manufacturing method thereof and a display device.

BACKGROUND OF THE INVENTION

An active matrix organic light emitting diode (referred to as AMOLED) panel is called as the next generation of display technology, white organic light-emitting diode (referred to as WOLED) and color filter (referred to as CF) technology serving as an important development direction of AMOLED attracts more attention, and an AMOLED display substrate manufactured by using the WOLED and CF technology has advantages of high utilization rate of electroluminescence (referred to as EL) materials, low requirement for a mask for evaporating EL, improvement of aperture ratio with top-emitting EL and the like.

A display device adopting the AMOLED display substrate needs a large cell gap. To ensure the cell gap of the display device, thicker photo spacers (referred to as PS) are required to be manufactured, and auxiliary electrodes are required to be formed on the photo spacers. However, the thicker photo spacers have the problem of poor profiles.

In conclusion, since the thicker photo spacers have the above problem, the technical solution of increasing the cell gap by improving the thickness of the photo spacers is limited, and then the cell gap of the display device is difficult to enlarge.

SUMMARY OF THE INVENTION

The present invention provides a display substrate and a manufacturing method thereof and a display device, for increasing the cell gap of the display device.

To achieve the above object, the present invention provides a display substrate, including a base substrate and color matrix patterns and photo spacers provided on the base substrate, edges of adjacent color matrix patterns are overlapped, and the photo spacers are provided above overlapped parts of the adjacent color matrix patterns.

Optionally, the display substrate further includes a light shield layer which is laminated with the overlapped parts of the adjacent color matrix patterns.

Optionally, the light shield layer is provided above the overlapped parts of the adjacent color matrix patterns and below the photo spacers.

Optionally, a width of longitudinal section of the overlapped part of the adjacent color matrix patterns is larger than that of longitudinal section of the light shield layer.

Optionally, a thickness of the photo spacers ranges from 3 nm to 6 nm.

Optionally, a width of one side of longitudinal section of each photo spacer close to the light shield layer is larger than that of the other side away from the light shield layer.

Optionally, material of the light shield layer includes organic resin or metal.

Optionally, the display substrate further includes auxiliary electrodes which are formed on the color matrix patterns and cover the photo spacers.

To achieve the above object, the present invention provides a display device, including the above display substrate.

To achieve the above object, the present invention provides a manufacturing method of a display substrate, including forming color matrix patterns and photo spacers on a base substrate, so that edges of adjacent color matrix patterns are overlapped, and the photo spacers are provided above overlapped parts of the adjacent color matrix patterns.

Optionally, the manufacturing method further includes forming a light shield layer which is laminated with the overlapped parts of the adjacent color matrix patterns.

Optionally, the manufacturing method includes: forming the color matrix patterns on the base substrate; forming the light shield layer on the overlapped parts of the adjacent color matrix patterns; and forming the photo spacers on the light shield layer.

In the technical solutions of the display substrate and the manufacturing method thereof and the display device provided by the present invention, the edges of the adjacent color matrix patterns are overlapped with each other, and the photo spacers are provided above the overlapped parts of the adjacent color matrix patterns, so that the thickness of the photo spacers is reduced, the purpose of increasing the cell gap of the display device is achieved while providing thinner photo spacers, and the cell gap of the display device is increased.

DETAILED DESCRIPTION OF THE EMBODIMENTS

To make those skilled in the art better understand the technical solutions of the present invention, a display substrate and a manufacturing method thereof and a display device provided by the present invention will be described in detail below in combination with the accompanying drawings.

Figure 1:
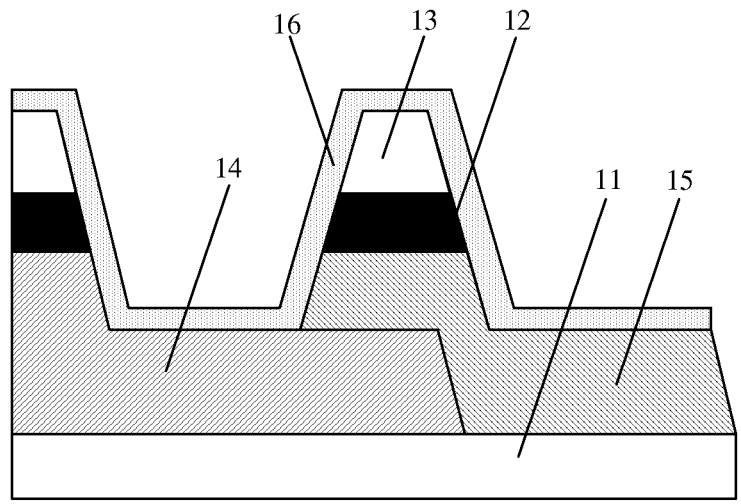
FIG. 1 is a structural schematic diagram of a display substrate provided by a first embodiment of the present invention.

FIG. 1 is a structural schematic diagram of a display substrate provided by a first embodiment of the present invention. As shown in FIG. 1, the display substrate includes a base substrate 11 and color matrix patterns and photo spacers 13 provided on the base substrate 11, edges of adjacent color matrix patterns are overlapped, and the photo spacers 13 are provided above overlapped parts of the adjacent color matrix patterns.

In this embodiment, the color matrix patterns may include red matrix patterns, green matrix patterns and blue matrix patterns, which are sequentially arranged on the base substrate 11. FIG. 1 is described by taking a red matrix pattern 14 and a green matrix pattern 15 sequentially arranged as an example. It should be noted that, in practical application, the color matrix patterns may also be matrix patterns of other colors, which are not listed one by one herein. As shown in FIG. 1, the edges of the adjacent red matrix pattern 14 and green matrix pattern 15 are overlapped, and a photo spacer 13 is provided above the overlapped part of the red matrix pattern 14 and the green matrix pattern 15. Specifically, the edges of the adjacent red matrix pattern 14 and green matrix pattern 15 are overlapped, so that the overlapped part is at the edges of the adjacent red matrix pattern 14 and green matrix pattern 15.

The display substrate further includes a light shield layer 12, which is laminated with the overlapped parts of the adjacent color matrix patterns. Preferably, the light shield layer 12 is provided above the overlapped parts of the adjacent color matrix patterns and below the photo spacer 13. That is to say, as shown in FIG. 1, the red matrix pattern 14, the green matrix pattern 15, the light shield layer 12 and the photo spacer 13 are sequentially laminated from bottom to top at the overlapped part of the edges of the adjacent red matrix pattern 14 and green matrix pattern 15.

Figure 2A:
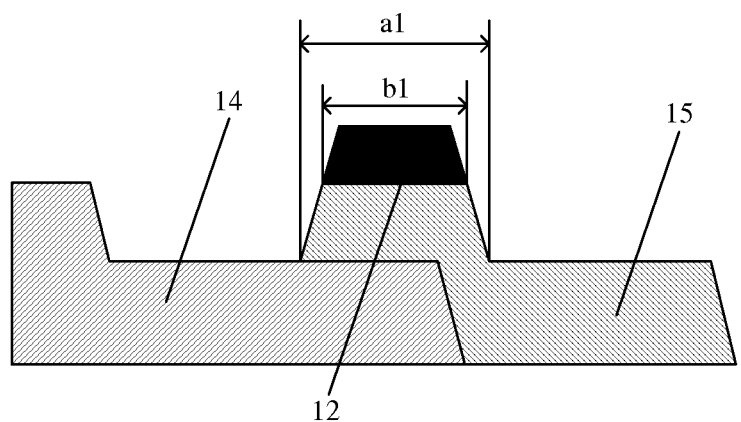
FIG. 2*a* is a structural schematic diagram of color matrix patterns and a light shield layer in the first embodiment.

Preferably, a width of the longitudinal section of each of the overlapped parts of the adjacent color matrix patterns is larger than width of the longitudinal section of the light shield layer 12. FIG. 2a is a structural schematic diagram of color matrix patterns and the light shield layer in the first embodiment. As shown in FIG. 2a, the width a1 of the longitudinal section of the overlapped part of the adjacent red matrix pattern 14 and green matrix pattern 15 is greater than the width b1 of the longitudinal section of the light shield layer 12. It should be noted that, b1 is the width of one side of the longitudinal section of the light shield layer 12 close to the color matrix patterns, and a1 is the width of the boundary between the adjacent color matrix patterns in the longitudinal section of the overlapped part.

Optionally, the light shield layer may be provided below the overlapped parts of the adjacent color matrix patterns, and the photo spacers are provided above the overlapped parts of the adjacent color matrix patterns, which is not specifically drawn.

In this embodiment, for example, the thickness of the photo spacers 13 ranges from 3 nm to 6 nm; the thickness of the light shield layer 12 ranges from 0.5 nm to 3 nm; and the thickness of the color matrix patterns ranges from 1.5 nm to 3 nm.

Figure 2B:
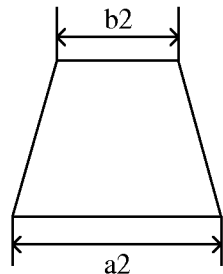
FIG. 2*b* is a specific structural schematic diagram of a photo spacer in the first embodiment.

Preferably, one side of the longitudinal section of each photo spacer 13 close to the light shield layer 12 is wider than the other side away from the light shield layer 12. FIG. 2b is a specific structural schematic diagram of the photo spacer in the first embodiment. As shown in FIG. 2b, the width a2 of one side of the longitudinal section of the photo spacer 13 close to the light shield layer 12 is greater than the width b2 of the other side away from the light shield layer 12. The longitudinal sections of the photo spacers 13 are isosceles trapeziums. In practical application, the photo spacers 13 may also be in other shapes, which are not listed one by one herein.

In this embodiment, material of the light shield layer 12 may include organic resin or metal. If the material of the light shield layer 12 is organic resin, preferably, the organic resin may be black resin, and in this case, the light shield layer 12 is a black matrix pattern. Alternatively, if the material of the light shield layer 12 is metal, preferably, the metal is one with relatively low reflectivity, which may be more than 0% and less than 5%, e.g. the metal may be Cr. In the drawings of this embodiment, the light shield layer 12 is a black matrix pattern as an example.

In this embodiment, material of the photo spacers 13 may be organic resin, e.g. the organic resin may include polyurethane, polyethylene or polycarbonate.

Optionally, the display substrate may further include auxiliary electrodes 16. The auxiliary electrodes 16 are formed on the color matrix patterns and cover the photo spacers 13. Preferably, the auxiliary electrodes 16 are made of a transparent conductive material, e.g. ITO or TZO. Preferably, the thickness of the auxiliary electrodes 16 ranges from 20 nm to 150 nm.

In the technical solution of the display substrate provided by this embodiment, the edges of the adjacent color matrix patterns are overlapped, and the photo spacers are provided above the overlapped parts of the adjacent color matrix patterns, so that the thickness of the photo spacers is reduced, the purpose of increasing the cell gap of the display device is achieved while providing thinner photo spacers, and the cell gap of the display device is increased. The edges of the adjacent color matrix patterns are overlapped, so that the cell gap of the display device is further increased. The light shield layer is provided on the color matrix patterns, so that the width of the light shield layer is reduced, and the aperture ratio and viewing angle of the display device are effectively improved. The light shield layer is provided on the color matrix patterns, so that side light leakage and cross color phenomena of the display device are also effectively eliminated. The thickness of the photo spacers is reduced in this embodiment, so that the problem of poor profiles of the photo spacers is solved, the profile of the auxiliary electrodes on the photo spacers is improved, the attachment and deformation resistance of the auxiliary electrodes are improved, and the risk that the auxiliary electrodes are peeled off in the cell pressing process is reduced. The width of one side of the longitudinal section of each photo spacer close to the light shield layer is larger than the width of the other side away from the light shield layer, so that the problem of poor profiles of the photo spacers is further solved. The cell gap of the display device is increased in this embodiment, so that the microcavity effect of EL is improved.

A second embodiment of the present invention provides a display device, including the display substrate provided by the first embodiment, the description of the display substrate is not repeated herein.

The display device may be an AMOLED display device, and in this case, the display device further includes a cell aligning substrate at the opposite position, the display substrate is an AMOLED substrate, and the cell aligning substrate is a glass substrate. Specifically, the AMOLED substrate may further include thin-film transistors (referred to as TFT), and preferably, the TFT is indium gallium zinc oxide (referred to as IGZO) TFT.

Alternatively, the display device may be a liquid crystal display device, and in this case, the display device further includes a cell aligning substrate at the opposite position. If the display substrate is a color filter substrate, the cell aligning substrate is an array substrate; and if the display substrate is a color filter on array (referred to as COA) substrate, the cell aligning substrate is a glass substrate.

In the technical solution of the display device provided by this embodiment, the edges of the adjacent color matrix patterns are overlapped, and the photo spacers are provided above the overlapped parts of the adjacent color matrix patterns, so that the thickness of the photo spacers is reduced, the purpose of increasing the cell gap of the display device is achieved while providing thinner photo spacers, and the cell gap of the display device is increased. The edges of the adjacent color matrix patterns are overlapped, so that the cell gap of the display device is further increased. The light shield layer is provided on the color matrix patterns, so that the width of the light shield layer is reduced, and the aperture ratio and viewing angle of the display device are improved. The light shield layer is provided on the color matrix patterns, so that side light leakage and cross color phenomena of the display device are also effectively eliminated. The thickness of the photo spacers is reduced in this embodiment, so that the problem of poor profiles of the photo spacers is solved, the profile of the auxiliary electrodes on the photo spacers is improved, the attachment and deformation resistance of the auxiliary electrodes are improved, and the risk that the auxiliary electrodes are peeled off in the cell pressing process is reduced. The width of one side of the longitudinal section of each photo spacer close to the light shield layer is larger than the width of the other side away from the light shield layer, so that the problem of poor profiles of the photo spacers is further solved. The cell gap of the display device is increased in this embodiment, so that the microcavity effect of EL is improved.

A third embodiment of the present invention provides a manufacturing method of a display substrate, comprising forming color matrix patterns and photo spacers on a base substrate, so that the adjacent color matrix patterns are overlapped, and the photo spacers are provided above overlapped parts of the adjacent color matrix patterns.

Optionally, the method may further comprise forming a light shield layer, which is laminated with the overlapped parts of the adjacent color matrix patterns.

Figure 3:
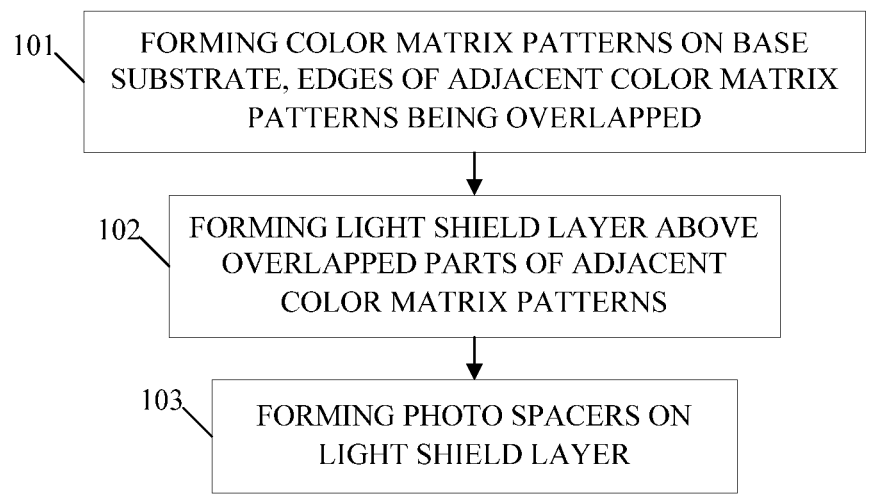
FIG. 3 is a flow chart of a manufacturing method of a display substrate provided by a third embodiment of the present invention.

FIG. 3 is a flow chart of a manufacturing method of a display substrate provided by the third embodiment of the present invention. As shown in FIG. 3, the method may comprise step 101, step 102 and step 103 below.

In step 101, color matrix patterns are formed on a base substrate, edges of the adjacent color matrix patterns are overlapped.

Figure 4A:
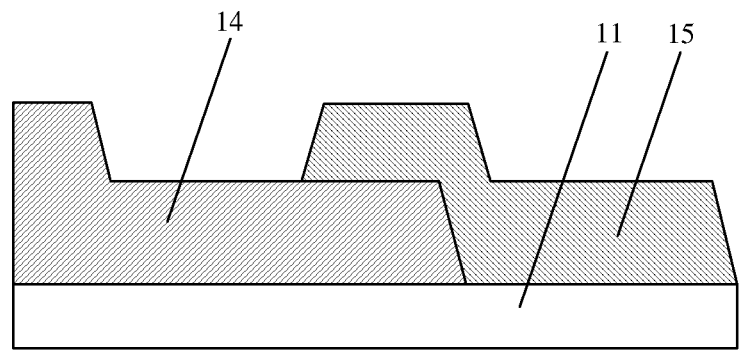
FIG. 4*a* is a schematic diagram of forming color matrix patterns in the third embodiment.

FIG. 4a is a schematic diagram of forming the color matrix patterns in the third embodiment. As shown in FIG. 4a, the color matrix patterns are formed on the base substrate 11. This step may include cleaning the base substrate 11, coating the base substrate 11 with a color matrix pattern material layer, and forming the color matrix patterns by performing a patterning process on the color matrix pattern material layer. Preferably, the base substrate is coated with the color matrix pattern material layer by a spin coating process. In FIG. 4a, the color matrix patterns are described by taking the red matrix pattern 14 and the green matrix pattern 15 arranged sequentially as an example.

In step 102, a light shield layer is formed on overlapped parts of the adjacent color matrix patterns.

Figure 4B:
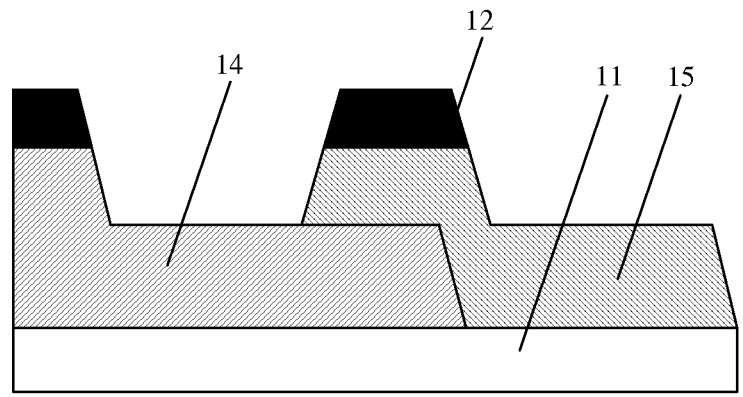
FIG. 4*b* is a schematic diagram of forming a light shield layer in the third embodiment.

FIG. 4b is a schematic diagram of forming the light shield layer in the third embodiment. As shown in FIG. 4b, the light shield layer 12 is formed on the overlapped parts of the adjacent color matrix patterns. This step may include coating the color matrix patterns with a light shield material layer, and forming the light shield layer 12 by performing a patterning process on the light shield material layer. Preferably, the color matrix patterns may be coated with the light shield material layer by a spin coating process. In this embodiment, the light shield layer 12 is a black matrix pattern.

In step 103, photo spacers are formed on the light shield layer.

Figure 4C:
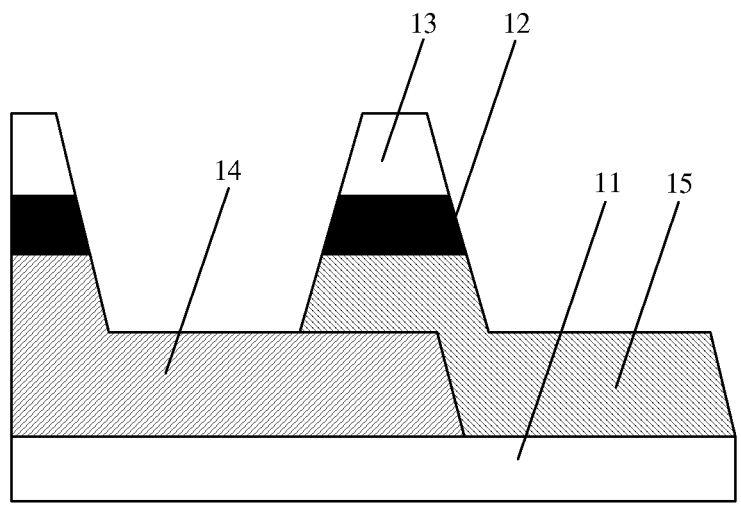
FIG. 4*c* is a schematic diagram of forming photo spacers in the third embodiment.

FIG. 4c is a schematic diagram of forming the photo spacers in the third embodiment. As shown in FIG. 4c, the photo spacers 13 are formed on the light shield layer 12. This step may include coating the light shield layer 12 with a photo spacer material layer, and forming the photo spacers 13 by performing a patterning process on the photo spacer material layer. Preferably, the light shield layer 12 may be coated with the photo spacer material layer by a spin coating process.

Further, the method may further comprise step 104 of forming auxiliary electrodes on the color matrix patterns, the auxiliary electrodes covering the photo spacers. As shown in FIG. 1, the auxiliary electrodes 16 are formed on the color matrix patterns, and cover the photo spacers 13. This step may include depositing the auxiliary electrodes 16 on the color matrix patterns through a sputter process.

In this embodiment, the patterning process may include photoresist coating, exposure, development, etching, photoresist stripping and the like.

In this embodiment, when the position relation between the structures is changed, the sequence of the steps of forming the structures may be correspondingly changed. For example, if the light shield layer is provided below the overlapped parts of the adjacent color matrix patterns, the step of forming the light shield layer may be performed first, and then the step of forming the color matrix patterns is performed.

The manufacturing method of the display substrate provided by this embodiment may be used for manufacturing the display substrate provided by the first embodiment. For the specific description of the display substrate, reference may be made to the first embodiment, which is not repeated herein.

In the technical solution of the display substrate manufactured by adopting the manufacturing method of the display substrate provided by this embodiment, the edges of the adjacent color matrix patterns are overlapped, and the photo spacers are provided above the overlapped parts of the adjacent color matrix patterns, so that the thickness of the photo spacers is reduced, the purpose of increasing the cell gap of the display device is achieved while providing thinner photo spacers, and the cell gap of the display device is increased. The edges of the adjacent color matrix patterns are overlapped, so that the cell gap of the display device is further increased. The light shield layer is provided on the color matrix patterns, so that the width of the light shield layer is reduced, and the aperture ratio and viewing angle of the display device are improved. The light shield layer is provided on the color matrix patterns, so that side light leakage and cross color phenomena of the display device are also effectively eliminated. The thickness of the photo spacers is reduced in this embodiment, so that the problem of poor profiles of the photo spacers is solved, the profile of the auxiliary electrodes on the photo spacers is improved, the attachment and deformation resistance of the auxiliary electrodes are improved, and the risk that the auxiliary electrodes are peeled off in the cell pressing process is reduced. The width of one side of the longitudinal section of each photo spacer close to the light shield layer is larger than the width of the other side away from the light shield layer, so that the problem of poor profiles of the photo spacers is further improved. The cell gap of the display device is increased in this embodiment, so that the microcavity effect of EL is improved.

It could be understood that, the above embodiments are merely exemplary embodiments adopted for describing the principle of the present invention, but the present invention is not limited thereto. Various variations and improvements may be made for those of ordinary skill in the art without departing from the spirit and essence of the present invention, and these variations and improvements are interpreted as within the protection scope of the present invention.

The invention claimed is:

1. A display substrate, comprising a base substrate and color matrix patterns and photo spacers provided on the base substrate,
   wherein edges of adjacent color matrix patterns are overlapped, and the photo spacers are provided above overlapped parts of the adjacent color matrix patterns,
   the display substrate further comprises a light shield layer which is laminated with the overlapped parts of the adjacent color matrix patterns, and
   wherein the light shield layer is provided above the overlapped parts of the adjacent color matrix patterns and below the photo spacers.

2. The display substrate of claim 1, wherein a width of longitudinal section of each of the overlapped parts of the adjacent color matrix patterns is larger than that of longitudinal section of the light shield layer.

3. The display substrate of claim 1, wherein a thickness of the photo spacers ranges from 3 μm to 6 μm.

4. The display substrate of claim 1, wherein a width of one side of longitudinal section of each photo spacer close to the light shield layer is larger than that of the other side away from the light shield layer.

5. The display substrate of claim 1, wherein material of the light shield layer includes organic resin or metal.

6. The display substrate of claim 1, further comprising auxiliary electrodes which are formed on the color matrix patterns and cover the photo spacers.

7. A display device, comprising a display substrate, the display substrate comprising a base substrate and color matrix patterns and photo spacers provided on the base substrate,
   wherein edges of adjacent color matrix patterns are overlapped, and the photo spacers are provided above overlapped parts of the adjacent color matrix patterns;
   the display substrate further comprises a light shield layer which is laminated with the overlapped parts of the adjacent color matrix patterns, and
   wherein the light shield layer is provided above the overlapped parts of the adjacent color matrix patterns and below the photo spacers.

8. The display device of claim 7, wherein a width of longitudinal section of each of the overlapped parts of the adjacent color matrix patterns is larger than that of longitudinal section of the light shield layer.

9. A manufacturing method of a display substrate, comprising forming color matrix patterns and photo spacers on a base substrate,
   wherein edges of adjacent color matrix patterns are overlapped, and the photo spacers are provided above overlapped parts of the adjacent color matrix patterns,
   the manufacturing method further comprises forming a light shield layer which is laminated with the overlapped parts of the adjacent color matrix patterns, and
   wherein the color matrix patterns are formed on the base substrate, the light shield layer is formed on the overlapped parts of the adjacent color matrix patterns, and the photo spacers are formed on the light shield layer.

10. The manufacturing method of the display substrate of claim 9, wherein a width of one side of longitudinal section of each photo spacer close to the light shield layer is set to be larger than that of the other side away from the light shield layer.

11. The manufacturing method of the display substrate of claim 9, wherein material of the light shield layer includes organic resin or metal.

12. The manufacturing method of the display substrate of claim 9, further comprising forming auxiliary electrodes on the color matrix patterns and the photo spacers.

13. The manufacturing method of the display substrate of claim 9, wherein a width of longitudinal section of each of the overlapped parts of the adjacent color matrix patterns is set to be larger than that of longitudinal section of the light shield layer.

14. The manufacturing method of the display substrate of claim 13, wherein a thickness of the photo spacers ranges from 3 μm to 6 μm.

* * * * *